(12) United States Patent
Park

(10) Patent No.: US 7,486,531 B2
(45) Date of Patent: Feb. 3, 2009

(54) LOW POWER CONTENT ADDRESSABLE MEMORY ARRAY (CAM) AND METHOD OF OPERATING SAME

(75) Inventor: Kee Park, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 53 days.

(21) Appl. No.: 11/203,058

(22) Filed: Aug. 12, 2005

(65) Prior Publication Data

US 2006/0098468 A1   May 11, 2006

Related U.S. Application Data

(60) Provisional application No. 60/626,809, filed on Nov. 9, 2004.

(51) Int. Cl.
*G11C 15/00* (2006.01)
(52) U.S. Cl. .............. 365/49.1; 365/49.16; 365/185.17; 365/49.17; 365/203; 365/189.11
(58) Field of Classification Search ................ 365/49.1, 365/49.16, 185.17, 49.17, 203, 189.11
See application file for complete search history.

(56) References Cited

U.S. PATENT DOCUMENTS

| | | | |
|---|---|---|---|
| 5,469,378 A | 11/1995 | Albon et al. | |
| 5,859,791 A | 1/1999 | Schultz et al. | |
| 5,870,324 A | 2/1999 | Helwig et al. | |
| 5,999,435 A | 12/1999 | Henderson et al. | |
| 6,044,005 A | 3/2000 | Gibson et al. | |
| 6,081,441 A | 6/2000 | Ikeda | |
| 6,166,938 A | 12/2000 | Wong | |
| 6,195,278 B1 | 2/2001 | Calin et al. | |
| 6,301,636 B1 | 10/2001 | Schultz et al. | |
| 6,829,153 B1 * | 12/2004 | Park et al. | 365/49 |
| 6,845,025 B1 * | 1/2005 | Nataraj | 365/49 |
| 6,879,532 B1 * | 4/2005 | Proebsting et al. | 365/203 |
| 6,965,519 B1 * | 11/2005 | Park et al. | 365/49 |
| 6,967,856 B1 * | 11/2005 | Park et al. | 365/49 |
| 6,972,978 B1 * | 12/2005 | Miller et al. | 365/49 |
| 2003/0012063 A1 * | 1/2003 | Chien | 365/200 |
| 2003/0123269 A1 * | 7/2003 | Gillingham et al. | 365/49 |

* cited by examiner

*Primary Examiner*—Thong Q Le
(74) *Attorney, Agent, or Firm*—Bever Hoffman & Harms, LLP.

(57) ABSTRACT

A content addressable memory (CAM) system that includes a row of NAND-type CAM cells divided into a plurality of segments. Each segment includes a plurality of series-connected switching transistors, wherein each of the switching transistors is part of a corresponding NAND-type CAM cell. The series-connected switching transistors of each segment are coupled to the series-connected switching transistors in an adjacent segment by a repeater circuit, thereby forming a chain of series-connected switching transistors and repeater circuits. A match line driver circuit is coupled to one end of the chain, and a match line is connected to the other end of the chain. If a match condition exists for the entire row, then a signal driven by the match line driver is propagated to the match line, through the chain of series-connected switching transistors and repeater circuits.

14 Claims, 12 Drawing Sheets

LOW POWER CONTENT ADDRESSABLE MEMORY ARRAY (CAM) AND METHOD OF OPERATING SAME

FIELD OF THE INVENTION

The present invention relates to content addressable memory (CAM) systems. More specifically the present invention relates to an improved CAM system utilizing a NAND structure.

RELATED ART

FIG. 1A is a circuit diagram of a conventional binary content addressable memory (CAM) cell 100 which implements a NOR-type configuration. NOR-type CAM cell 100 includes n-channel transistors 101-107 and p-channel transistors 108-109. Transistors 103 and 108 are configured to form a first inverter 111, and transistors 104 and 109 are configured to form a second inverter 112. Inverters 111 and 112 are cross-coupled to form a storage latch. Access transistors 101 and 102 are coupled between bit lines BL and BL#, respectively, and the input terminals of inverters 112 and 111, respectively. The gates of access transistors 101 and 102 are coupled to word line WL. A data value is written to CAM cell 100 by activating word line WL high, and applying complementary data signals to bit lines BL/BL#.

Comparator transistors 105-106 are connected in series between bit lines BL and BL#, with transistors 105 and 106 being connected at node N1. The gates of comparator transistors 105 and 106 are coupled to the output terminals of inverters 112 and 111, respectively. Transistors 101-106 and 108-109 are hereinafter referred to as the core cell 110 of NOR-type CAM cell 100.

NOR-type switching transistor 107 is connected between match line ML and ground, with the gate of switching transistor 107 connected to node N1. During a compare operation, a complementary compare data value is applied to bit lines BL and BL#, and the match line ML is pre-charged to a high voltage equal to the $V_{CC}$ supply voltage (or a slightly lower voltage). If the compare data value matches the stored data value, then a logic low voltage is applied to node N1, thereby turning off switching transistor 107, and maintaining the high state on match line ML. Conversely, if the compare data value does not match the stored data value, then a logic high voltage is applied to node N1, thereby turning on switching transistor 107, and causing the match line ML to be discharged to ground.

FIG. 1B illustrates a row of a CAM array formed by a plurality of NOR-type CAM cells, identical to CAM cell 100. This row represents one word of the CAM array. If one of the NOR-type CAM cells in the row exhibits a non-match condition, the corresponding switching transistor 107 will pull down the entire match line ML to a logic low value.

The NOR configuration of CAM cell 100 results in a relatively high power consumption due to the discharging of a large number of match lines during each compare operation. (A typical compare operation results in a relatively large number of non-match results and a relatively small number of match results). To alleviate this high power consumption, the NOR configuration of CAM cell 100 can be replaced with a CAM cell having a NAND configuration.

FIG. 2A is a circuit diagram of a conventional CAM cell 200 which implements a NAND configuration. NAND-type CAM cell 200 includes n-channel transistors 101-104, p-channel transistors 108-109, inverters 111-112, word line WL and bit lines BL and BL#, which were described above in connection with the NOR-type CAM cell 100 of FIG. 1A.

CAM cell 200 additionally includes comparator transistors 205-206, which are connected in series between bit lines BL and BL#, with transistors 205 and 206 being connected at node N2. The gates of comparator transistors 205 and 206 are coupled to the output terminals of inverters 111 and 112, respectively. Transistors 101-104, 205-206 and 108-109 are hereinafter referred to as the core cell 210 of NAND-type CAM cell 200.

NAND-type switching transistor 207 is connected in series between input match line segment $ML_I$ and output match line segment $ML_O$, with the gate of switching transistor 207 connected to node N2.

During a compare operation, a complementary compare data value is applied to bit lines BL and BL#, the input match line $ML_I$ is pre-charged to a low voltage (e.g., ground), and the output match line $ML_O$ is pre-charged to a high voltage (e.g., $V_{CC}$). If the compare data value matches the stored data value, then a logic high voltage is applied to node N2, thereby turning on switching transistor 207, and causing the output match line $ML_O$ to be pulled down to a logic low state. Conversely, if the compare data value does not match the stored data value, then a logic low voltage is applied to node N2, thereby turning off switching transistor 207, and causing the output match line $ML_O$ to remain at a high state.

FIG. 2B illustrates a row of a CAM array formed by a plurality of NAND-type CAM cells, identical to CAM cell 200. This row represents a data word stored in the CAM array. The output match line segment $ML_O$ of each CAM cell is connected to the input match line segment $ML_I$ of an adjacent CAM cell. The input match line segment $ML_I$ of the left-most CAM cell is coupled to ground and the output match line segment $ML_O$ of the right-most CAM cell is pre-charged to a high state by transistor 250. If all of the CAM cells in the row exhibit a match condition, then all of the switching transistors 207 are turned on, and the match line ML is pulled down, thereby indicating a match condition. However, if any one of the NAND-type CAM cells in the row does not exhibit a match condition, then the corresponding switching transistor 207 is turned off, thereby preventing the match line ML from being pulled down.

The NAND structure of CAM cell 200 advantageously reduces power consumption, because the match line ML is only switched in response to a match condition.

However, as the width of the row of NAND-type CAM cells 200 (i.e., the word width) increases, the number of NAND-type switching transistors connected in series increases. As a result, a relatively long delay exists until all of the switching transistors in a row can be discharged during a match condition. To reduce this delay in the switching time, U.S. Pat. Nos. 5,859,791 and 6,195,278 have suggested dividing each row into two match line chains.

FIG. 2C illustrates a row of an array divided into two match line chains as suggested by U.S. Pat. No. 5,859,791. Each of the two match line chains is connected to a corresponding inverter 218, and each output of the two inverters 218 is connected to an AND gate 220. However, one end of each match line chain requires a ground connection and the other end of each match line chain requires an inverter 218 and an AND gate 220. Moreover, the layout of the match line chains should be symmetrical to ensure that AND gate 220 receives the input signals from inverters 218 at about the same time.

It would therefore be desirable to have a CAM array having a NAND configuration, that implements a relatively wide data word with a relatively small delay, but does not require a symmetrical layout or excessive additional logic for each row.

SUMMARY

Accordingly, the present invention provides a CAM system that includes a relatively long row of NAND-type CAM cells divided into a plurality of segments. For example, a row of 72 NAND-type CAM cells may be divided into eight segments, wherein each segment includes nine NAND-type CAM cells. Each segment includes a plurality of series-connected switching transistors, wherein each of the switching transistors is part of a corresponding NAND-type CAM cell. Thus, the nine NAND-type CAM cells would have nine corresponding switching transistors, all connected in series. The series-connected switching transistors of each segment are coupled to the series-connected switching transistors in an adjacent segment by a repeater circuit, thereby forming a chain of series-connected switching transistors and repeater circuits. The repeater circuit can be, for example, a pair of series connected inverters, which increase the drive of a received signal.

A match line driver circuit is coupled to a first end of the chain of series-connected switching transistors and repeater circuits. The match line driver circuit is configured to apply a predetermined voltage to the first end of the chain during a comparison operation. This voltage can be a logic high or a logic low voltage, depending upon the logic of the circuit.

A match line is connected to the second end of the chain of series-connected switching transistors and repeater circuits. If a match condition exists for the entire row of NAND-type CAM cells, then all of the series-connected switching transistors are turned on, and a signal driven by the match line driver is propagated to the match line, through the chain of series-connected switching transistors and repeater circuits. The repeater circuits ensure that the signal driven by the match line driver is propagated through the entire chain without undue delay.

The invention can be implemented using either DRAM or SRAM type CAM cells. The present invention can be applied to binary, ternary or quaternary CAM cells.

The present invention will be more fully understood in view of the following description and drawings.

DETAILED DESCRIPTION

Figure 1A:
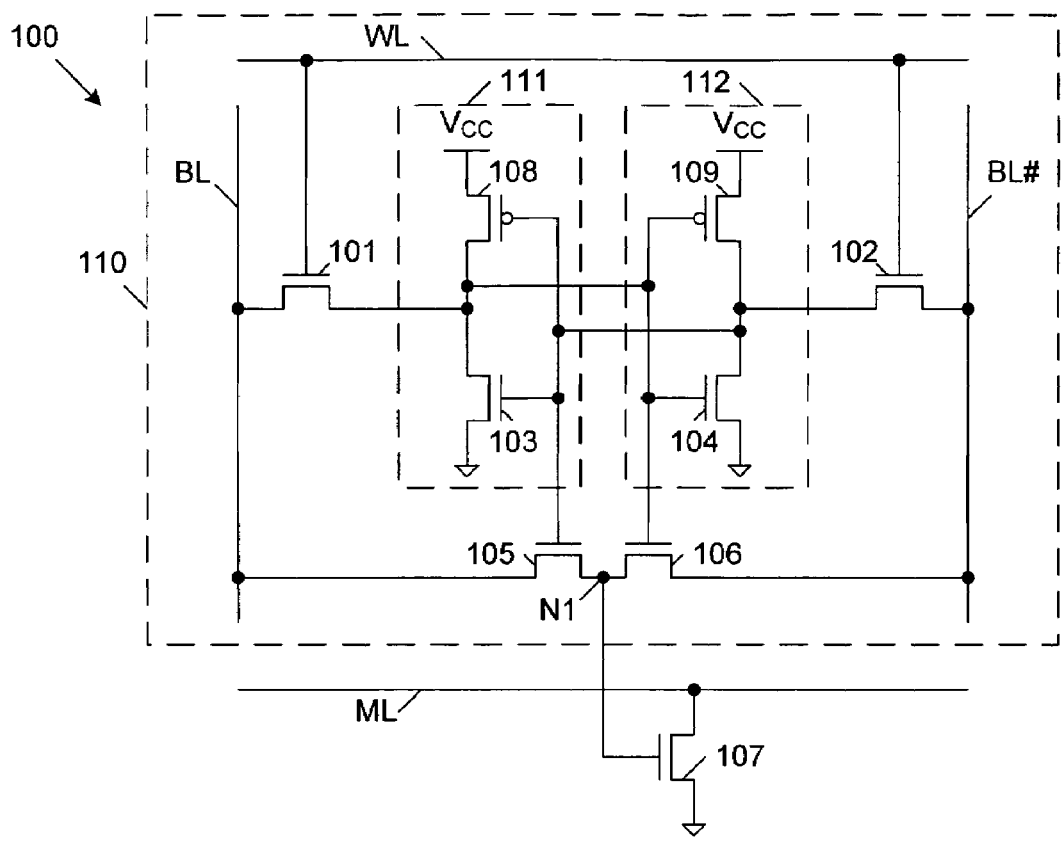
FIG. 1A is a circuit diagram of a conventional content addressable memory (CAM) cell which implements a NOR-type configuration.
Figure 1B:
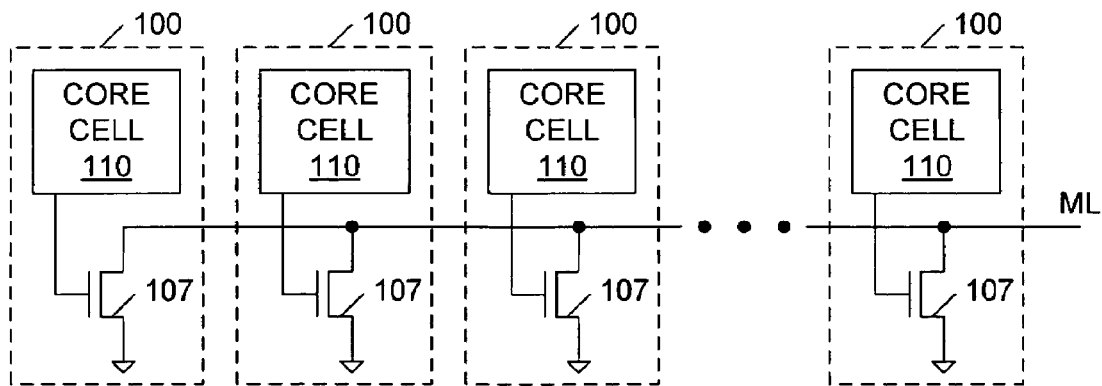
FIG. 1B is a circuit diagram illustrating a row of an array formed by a plurality of NOR-type CAM cells identical to the CAM cell of FIG. 1A.
Figure 2A:
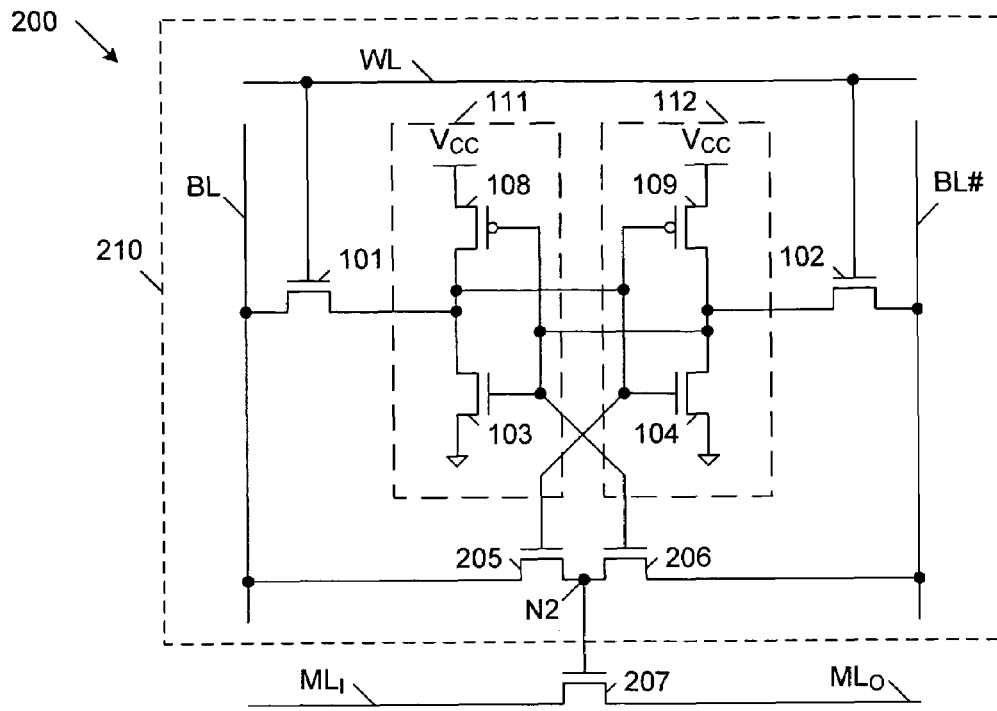
FIG. 2A is a circuit diagram of a conventional CAM cell, which implements a NAND configuration.
Figure 2B:
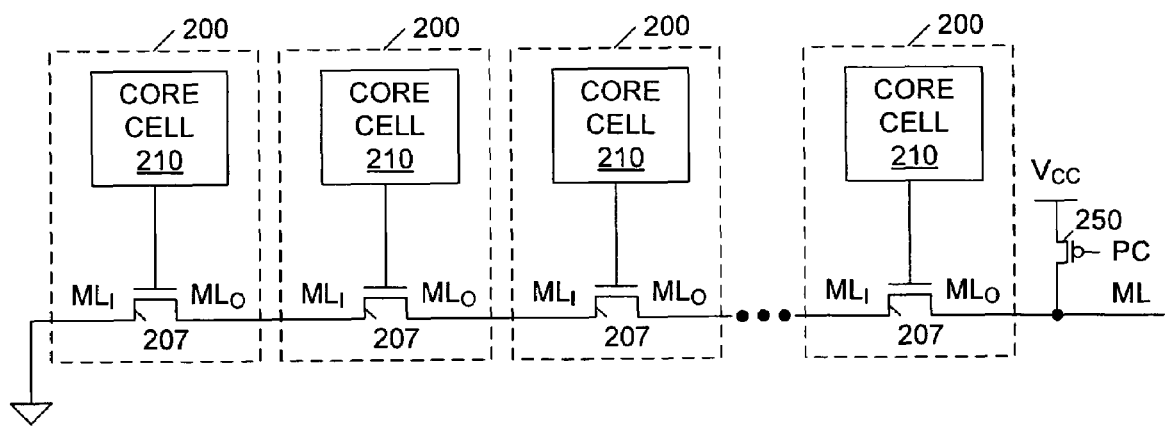
FIG. 2B is a circuit diagram illustrating a row of an array formed by a plurality of NAND-type CAM cells identical to the CAM cell of FIG. 2A.
Figure 2C:
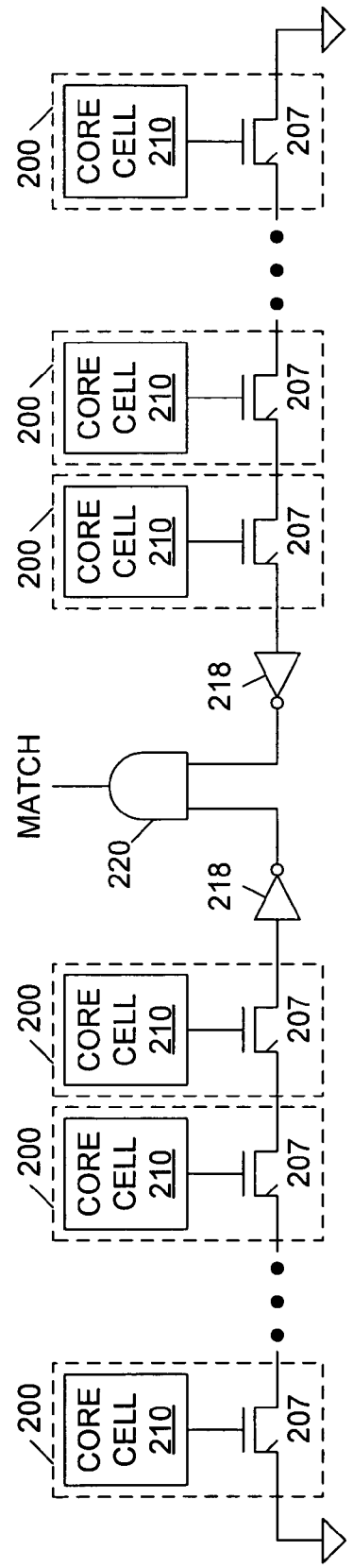
FIG. 2C is a circuit diagram illustrating a row of a conventional NAND-type CAM array divided into two match line chains.
Figure 3:
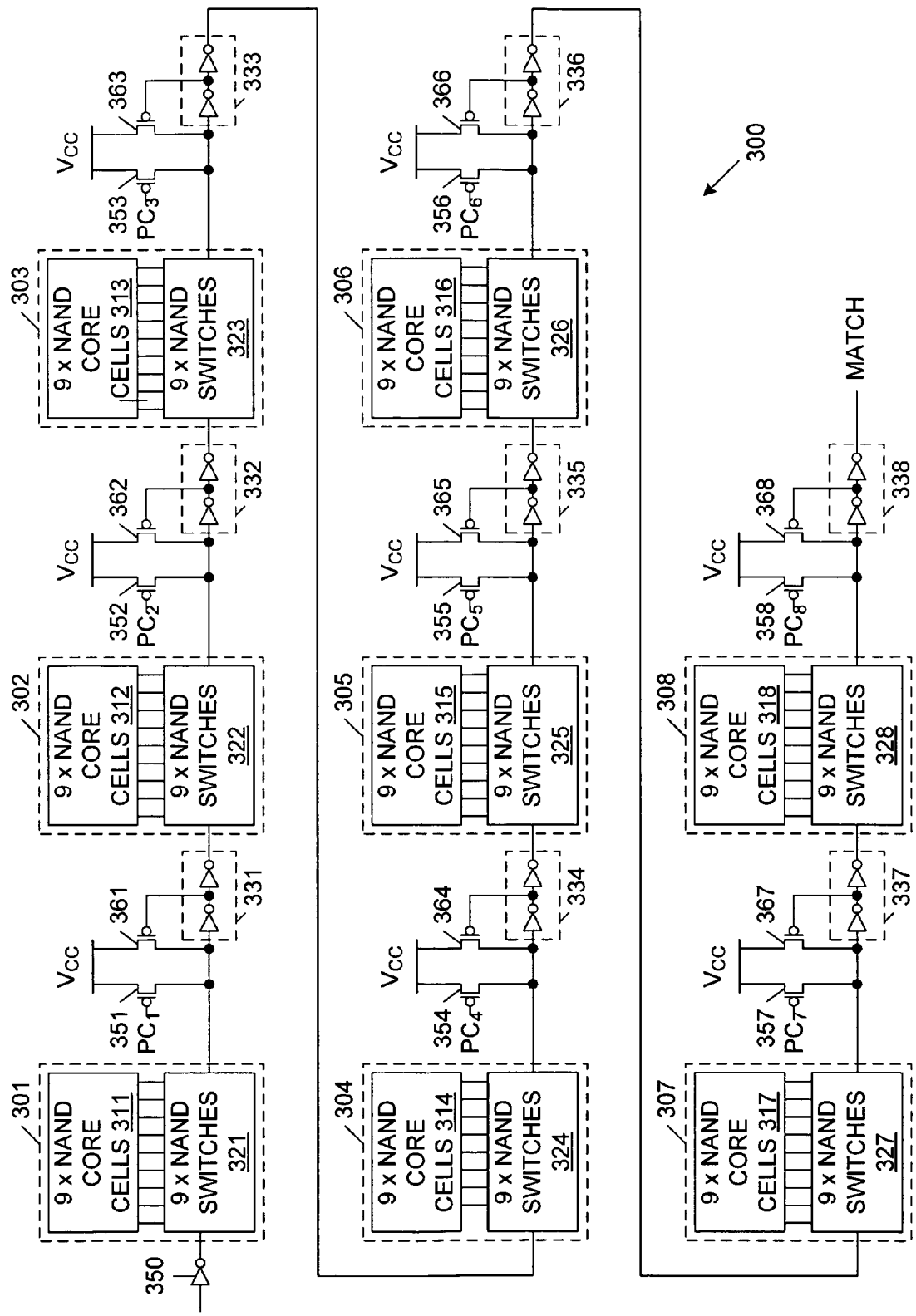
FIG. 3 is a block diagram of a row of NAND-type CAM cells in accordance with one embodiment of the present invention.

FIG. 3 is a block diagram of a row 300 of NAND-type CAM cells in accordance with one embodiment of the present invention. In this embodiment, row 300 has a width of 72 CAM cells (72-bits), wherein each of these CAM cells is identical to NAND-type CAM cell 200 (FIG. 2A). Although only one row of CAM cells is illustrated in FIG. 3, it is understood that multiple rows, identical to row 300, can be provided to form a CAM array.

Row 300 is divided into eight sets of CAM cells 301-308, wherein each set includes nine NAND-type CAM cells. Each of these CAM cells includes a NAND-type core cell (identical to core cell 210 of FIG. 2A) and a NAND-type switching transistor (identical to switching transistor 207 of FIG. 2A). Thus, each set of CAM cells 301-308 includes a corresponding set of nine NAND-type core cells 311-318, respectively, and a corresponding set of nine NAND-type switching transistors 321-328, respectively.

In alternate embodiments, the NAND-type core cell can be different than core cell 210 of FIG. 2A. For example, the core cell can include a first bit line pair for writing data to the core cell, and a second bit line pair for applying compare data values to the core cell during comparison operations. Alternately, the core cell can include a dynamic storage cell, rather than a static storage cell. Moreover, the core cell can include binary, ternary or quaternary cell structures in other embodiments.

Although row 300 includes 72 CAM cells, divided into eight sets of 9 CAM cells each, it is understood that other numbers of CAM cells, other numbers of sets, and other numbers of CAM cells per set can be used in other embodiments.

Each of the nine NAND-type switching transistor sets is connected to an adjacent NAND-type switching transistor set by a corresponding repeater. For example, repeater 332 connects NAND-type switching transistor sets 322 and 323. In the described example, each of repeaters 331-338 is formed by a series-connected pair of inverters. Each repeater provides for a boosted signal between adjacent CAM cell sets. That is, each repeater drives a boosted match signal to an adjacent CAM cell set, without the delay typically introduced by a long series connection of NAND-type CAM cells. Repeater 338 is connected between NAND-type switching transistor set 328 and the MATCH line. A match line input driver 350 is connected to NAND-type switching transistor set 321.

Each of repeaters 331-338 has an associated weak p-channel pull-up transistor 361-368, respectively, and an associated p-channel pre-charge transistor 351-358, respectively. For example, weak pull-up transistor 362 has a gate coupled to the output terminal of the first inverter of repeater 332, a drain coupled to the input terminal of the first inverter of repeater 332, and a source coupled to the $V_{CC}$ voltage supply terminal. Thus, when a logic high input signal is applied to repeater 332, the first inverter of this repeater provides a logic low signal to the gate of transistor 362, thereby turning on this transistor. As a result, transistor 362 pulls up the voltage on the input of repeater 332. Because transistor 362 is a weak pull-up transistor, a logic low value applied to the input terminal of repeater 332 causes the first inverter of repeater 332 to provide a logic high signal to the gate of transistor 362, thereby turning off this transistor. Weak pull-up transistors 361 and 363-368 operate in the same manner as weak pull-up transistor 362.

Pre-charge transistors 351-358 are coupled between the input terminals of repeaters 331-338, respectively, and the $V_{CC}$ supply voltage. Pre-charge transistors 351-358 are controlled by pre-charge control signals $PC_1$-$PC_8$, respectively. When a pre-charge control signal is activated low, the input terminal of the associated repeater is pre-charged to the $V_{CC}$ supply voltage.

Figure 4:
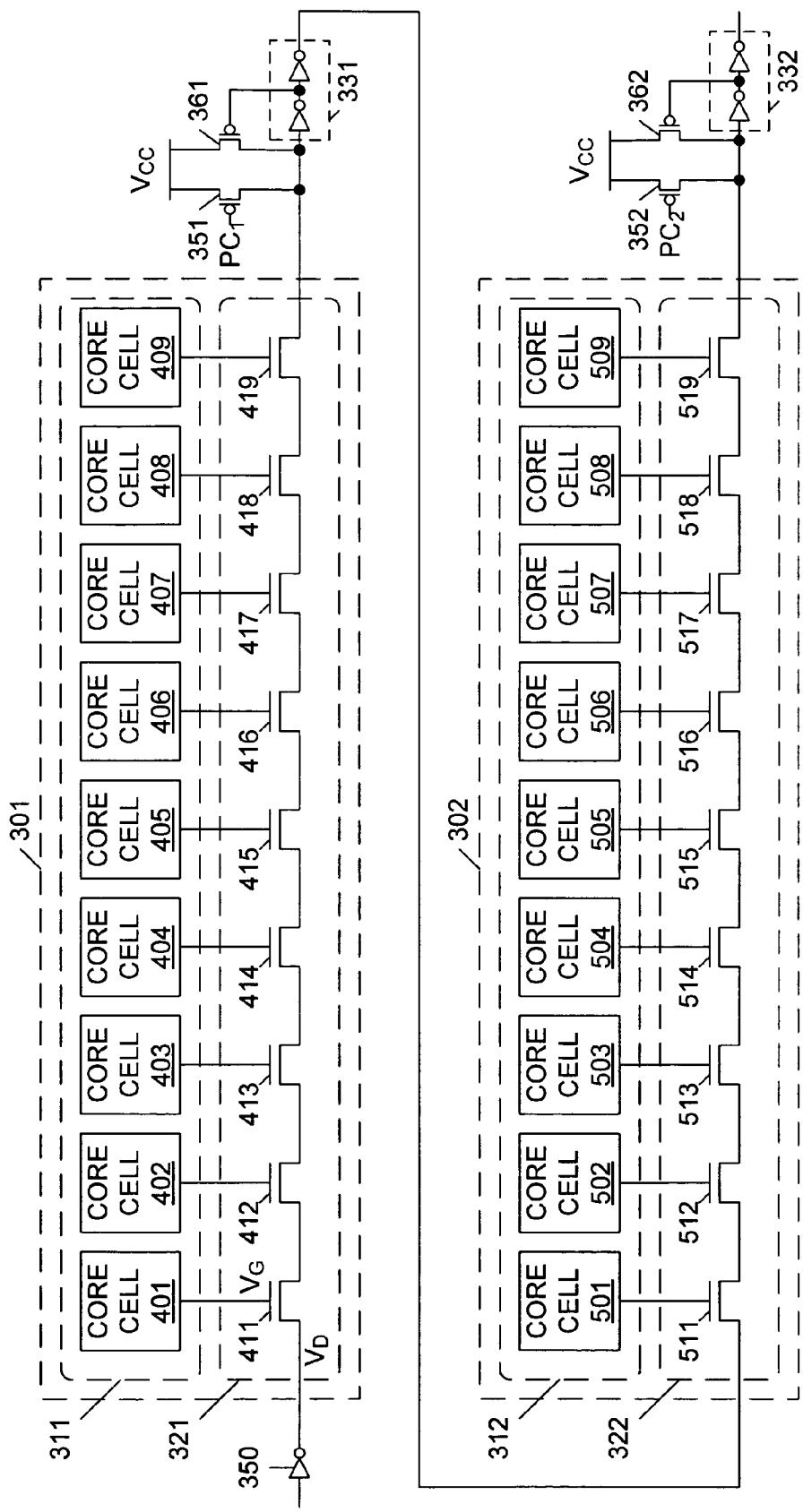
FIG. 4 is a block diagram illustrating selected NAND-type CAM cell sets, repeaters and a match line input driver of FIG. 3 in more detail.

FIG. 4 is a block diagram illustrating the NAND-type CAM cell sets 301-302, repeaters 331-332, pre-charge transistors 351-352, pull-up transistors 361-362 and match line input driver 350 in more detail. As illustrated, NAND-type core cell set 311 includes nine NAND-type core cells 401-409, and NAND-type core cell set 312 includes nine NAND-type core cells 501-509. NAND-type switching transistor set 321 includes nine series-connected NAND-type switching transistors 411-419, and NAND-type switching transistor set 322 includes nine series-connected NAND-type switching transistors 511-519.

During a pre-charge period, match line input driver 350 is controlled to drive a logic high voltage to the drain of switching transistor 411. In addition, each of the pre-charge control signals $PC_1$-$PC_8$ is activated low, thereby turning on pre-charge transistors 351-358, respectively. As a result, the source of the last transistor in each of the transistor sets 321-322 (e.g., the source of transistor 419 and the source of transistor 519) is pre-charged to a logic high voltage ($V_{CC}$). In addition, each of the repeaters 331-338 provides a logic high output voltage in response to the $V_{CC}$ voltage applied to the input terminal of the repeater. The weak pull-up transistors 361-368 latch the logic high signals on the input and output terminal of each repeater 331-338.

Also during the pre-charge period, comparison data values are applied to the CAM cells of CAM core cell sets 311-318, thereby changing the comparison result of each of the CAM core cells. After the CAM core cells provide the new comparison results, the pre-charge control signals $PC_1$-$PC_8$ are de-activated high, thereby turning off pre-charge transistors 351-358, respectively. At the same time, the first match line driver 350 drives a logic low value to transistor 411.

If the 9 bits of the comparison data value applied to CAM cell set 301 matches the contents of core cells 401-409, then the corresponding switching transistors 411-419 are all turned on. In this case, the logic low voltage driven by match line input driver 350 is propagated to repeater 331. In response, repeater 331 drives a logic low (ground) voltage to the drain of switching transistor 511. Repeater 331 also drives a logic high signal to the gate of transistor 361, thereby turning off this transistor and de-coupling the $V_{CC}$ voltage supply terminal from the input terminal of repeater 331.

If the 9 bits of the comparison data value applied to CAM cell set 302 matches the contents of core cells 501-509, then the corresponding switching transistors 511-519 are also all turned on. In this case, the logic low voltage driven by repeater 331 is propagated to repeater 332. In response, repeater 332 drives a logic low (ground) voltage to the corresponding switching transistor in switching transistor set 323. If all 72-bits of the comparison data value match the contents of the CAM cells in row 300, then the logic low signal provided by match line driver circuit 350 is propagated through all of repeaters 331-338, thereby driving the signal on the MATCH line to a logic low voltage. Such a logic low voltage on the MATCH line identifies a match condition in row 300.

Figure 5:
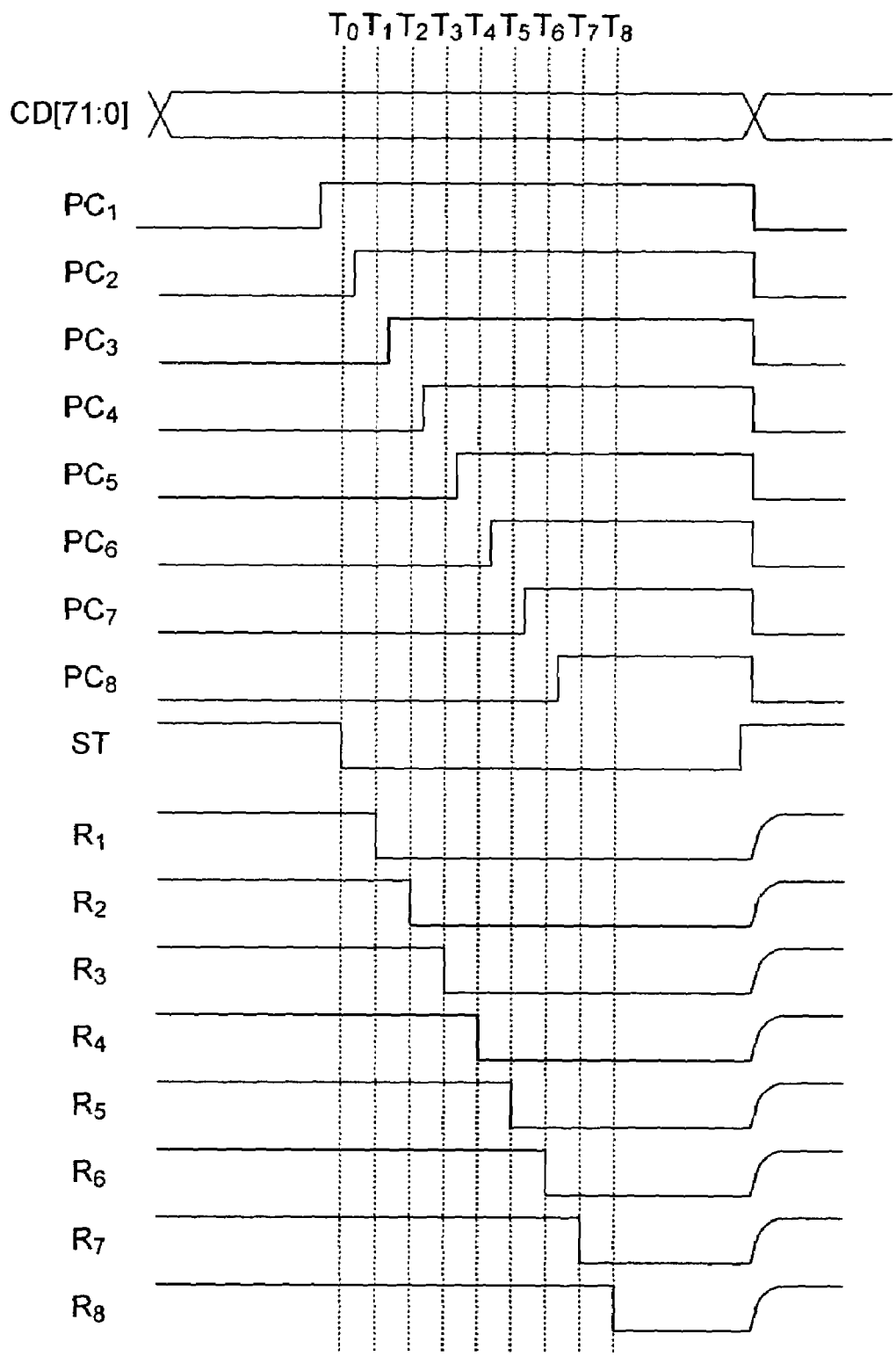
FIG. 5 is a waveform diagram illustrating a match condition in the row of NAND-type CAM cells of FIG. 3.

FIG. 5 is a waveform diagram illustrating a match condition in row 300. Initially, the pre-charge signals $PC_1$-$PC_8$ are activated low and a comparison data value CD[72:0] is applied to the core cells in core cell sets 311-318. Just before time $T_0$, the pre-charge signal $PC_1$ is de-activated high. At time $T_0$, match line driver circuit 350 provides a logic low output value signal (ST). The logic low ST signal propagates through repeaters 331-338, thereby driving the output signals provided by repeaters 331-338 to logic low values at times $T_1$-$T_8$, respectively. The output signals provided by repeaters 331-338 are labeled as signals $R_1$-$R_8$, respectively, in FIG. 5. Note that the pre-charge signals $PC_2$-$PC_8$ are de-activated high prior to times $T_1$-$T_7$, respectively. Although pre-charge signals $PC_2$-$PC_8$ are de-activated in a staggered manner in the illustrated embodiment, it is understood that all of pre-charge signals $PC_1$-$PC_8$ can be de-activated high at the same time (before time $T_0$).

If the data values stored in the CAM cells in row 300 do not match the applied comparison data value, the switching transistors in un-matched bits will be turned off. The turned off switching transistors located closest to match line driver circuit 350 will stop the propagation of the logic low value driven by match line driver circuit. For example, in FIG. 4, switching transistor 515 may be turned off because the data value stored in core cell 505 does not match the comparison data value applied to core cell 505. If switching transistors 411-419 and 511-514 are all turned on (because the data values stored in core cells 401-409 and 501-504 all match the applied comparison data values), then switching transistor 515 would be the turned off switching transistor closest to match line driver circuit 350. In this case, only the nodes of the switching transistors 411-419 and 511-514 (i.e., the switching transistors located to the left of switching transistor 515) are discharged to a logic low state. Consequently, the logic low signal driven by match line driver circuit 350 does not propagate beyond switching transistor 515 (i.e., the switching transistor of the left-most non-matching CAM cell). This results in power savings within row 300.

Figure 6:
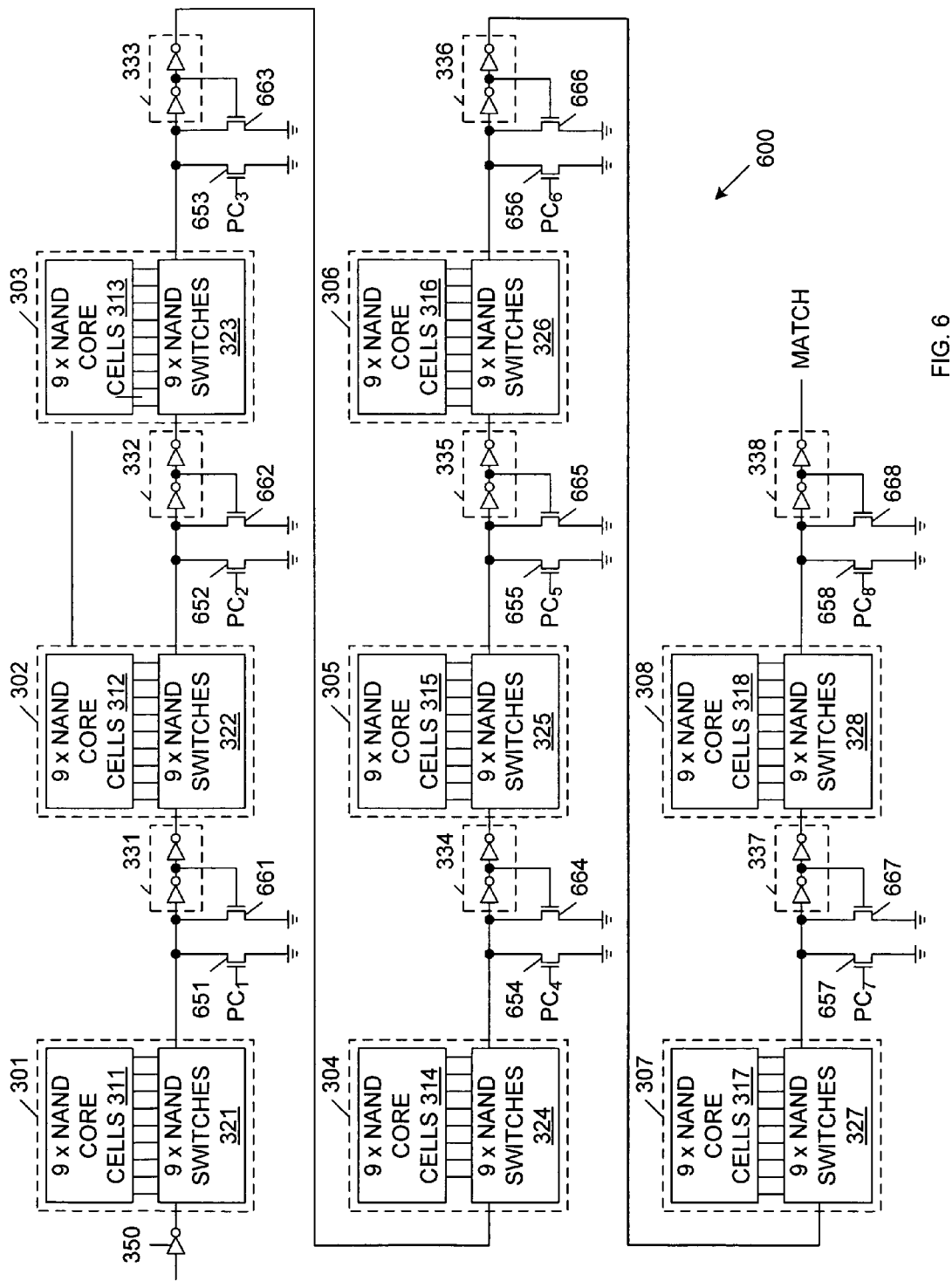
FIG. 6 is a block diagram of a row of NAND-type CAM cells in accordance with another embodiment of the present invention.

FIG. 6 is a block diagram of a row 600 of NAND-type CAM cells in accordance with another embodiment of the present invention. Similar elements of row 300 (FIG. 3) and row 600 (FIG. 6) are labeled with similar reference numbers. Thus, row 600 includes CAM cell sets 301-308 (which include NAND-type core cell sets 311-318 and NAND-type switching transistor sets 321-328), and repeaters 331-338. Each of repeaters 331-338 has an associated weak n-channel pull-down transistor 661-668, respectively, and an associated n-channel pre-charge transistor 651-658, respectively. For example, weak pull-down transistor 662 has a gate coupled to the output terminal of the first inverter of repeater 332, a drain coupled to the input terminal of the first inverter of repeater 332, and a source coupled to the ground voltage supply terminal. Thus, when a logic low input signal is applied to repeater 332, the first inverter of this repeater provides a logic high signal to the gate of transistor 662, thereby turning on this transistor. As a result, transistor 662 pulls down the voltage on the input of repeater 332. Because transistor 662 is a weak pull-down transistor, a logic high value applied to the input terminal of repeater 332 causes the first inverter of repeater 332 to provide a logic low signal to the gate of transistor 662, thereby turning off this transistor. Weak pull-down transistors 661 and 663-668 operate in the same manner as weak pull-down transistor 662.

Pre-charge transistors 651-658 are coupled between the input terminals of repeaters 331-338, respectively, and the ground voltage supply terminal. Pre-charge transistors 651-658 are controlled by pre-charge control signals $PC_1$-$PC_8$, respectively. When a pre-charge control signal is activated high, the input terminal of the associated repeater is pre-charged to the ground supply voltage.

Although only one row of CAM cells is illustrated in FIG. 6, it is understood that multiple rows, identical to row 600, can be provided to form a CAM array.

Match line driver 350 drives a pulse signal ($V_P$) to transistor 411 in NAND-type switching transistor set 321 during a comparison operation. The pulse signal $V_P$ is initially low ($V_{SS}$, or ground), and is subsequently activated high ($V_{CC}$) for a short period, after the CAM cells have had adequate time to perform the comparison operation. That is, the pulse signal $V_P$ is activated high when the NAND-type switching transistors have been enabled or disabled in response to the comparison operation. When the data value stored in CAM core cell 401 matches the applied comparison data value, and the pulse signal $V_P$ is de-activated to a low ($V_{SS}$) voltage level, the voltage applied to the gate of switching transistor 411 ($V_G$) will be equal to $V_{CC}$-$V_T$, where $V_T$ is the threshold voltage of a comparator transistor of the CAM core cell 401 (see, e.g., comparator transistors 205-206; FIG. 2A). However, when the pulse signal $V_P$ is activated at a high $V_{CC}$ voltage level, the gate voltage $V_G$ of switching transistor 411 is bootstrapped to a voltage greater than the $V_{CC}$ voltage level plus the threshold voltage ($V_{TS}$) of switching transistor 411 (i.e., $V_G$>$V_{CC}$+$V_{TS}$)

Figure 7:
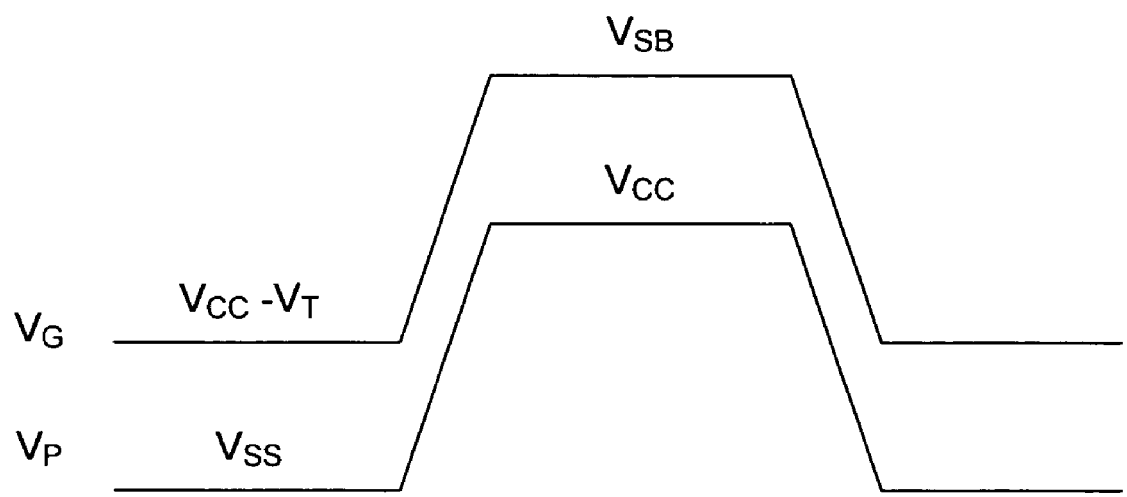
FIG. 7 is a waveform diagram illustrating a pulse signal $V_P$ and the gate voltage $V_G$ of a switching transistor, when the data value stored in corresponding CAM core cell matches an applied compare data value.

FIG. 7 is a waveform diagram illustrating the pulse signal $V_P$ and the gate voltage $V_G$ of switching transistor 411, when the data value stored in CAM core cell 401 matches the applied compare data value. Because the gate voltage $V_G$ of switching transistor 411 reaches a voltage ($V_{SB}$) that is greater than $V_{CC}$ plus $V_{TS}$, the source of switching transistor 411 exhibits a voltage equal to the full $V_{CC}$ voltage, without a $V_T$ voltage drop. This high source voltage facilitates the propagation of the pulse signal $V_P$ through the subsequent switching transistors.

If all of the CAM cells in CAM cell blocks 301-308 exhibit a match condition, then the activated state of pulse signal $V_P$ is propagated through all of the switching transistors, and provided at the output of repeater 338, thereby identifying a match condition.

The repeaters 331-338 speed up the comparison operation by splitting the 72 series-connected switching transistors into eight relatively small segments of 9 series-connected switching transistors. As a result, each of repeaters 331-338 drives, at most, nine series-connected switching transistors. Splitting the series-connected switching transistors into N segments results in each of the segments exhibiting a delay that is equal to $1/N^2$ times the delay of the entire series-connected set of switching transistors. Thus, in the present example, each set of nine NAND-type switching transistor sets 321-328 exhibits a delay that is equal to 1/64 of the delay of 72 series-connected switching transistors. As a result, the combined delay of the nine NAND-type switching transistor sets 321-328 is equal to about 1/8 (i.e., 8×1/64) of the delay of 72 series-connected switching transistors.

Figure 8:
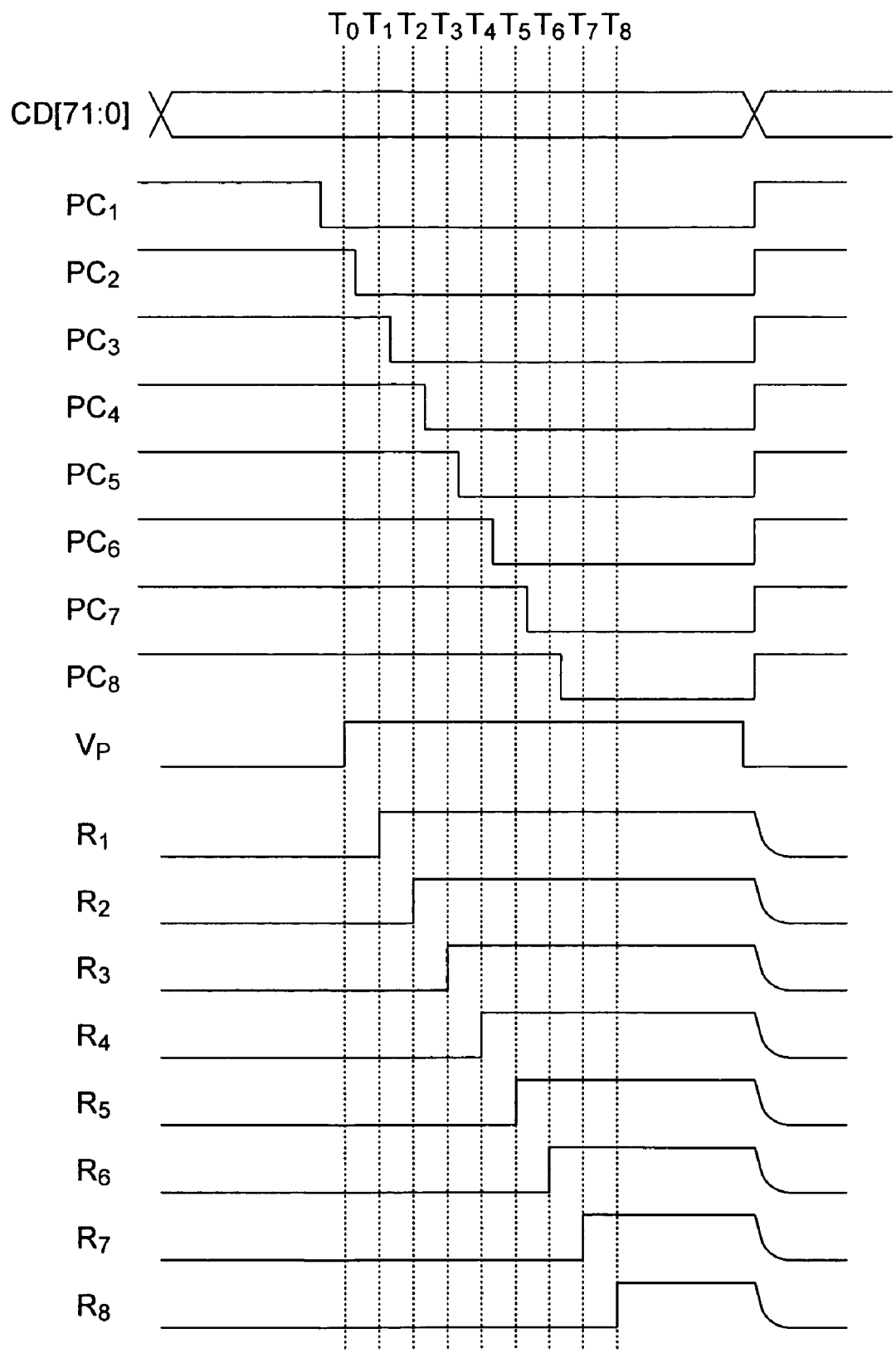
FIG. 8 is a waveform diagram illustrating a match condition in the row of NAND-type CAM cells of FIG. 6.

FIG. 8 is a waveform diagram illustrating a match condition in row 600. Initially, the pre-charge signals $PC_1$-$PC_8$ are activated high and a comparison data value CD[72:0] is applied to the core cells in core cell sets 311-318. Just before time $T_0$, the pre-charge signal $PC_1$ is de-activated low. At time $T_0$, match line driver circuit 350 provides a logic high pulse signal $V_P$. The logic high $V_P$ signal propagates through repeaters 331-338, thereby driving the output signals provided by repeaters 331-338 to logic high values at times $T_1$-$T_8$, respectively. The output signals provided by repeaters 331-338 are labeled as signals $R_1$-$R_8$, respectively, in FIG. 8. Note that the pre-charge signals $PC_2$-$PC_8$ are de-activated low prior to times $T_1$-$T_7$, respectively. Although pre-charge signals $PC_2$-$PC_8$ are de-activated in a staggered manner in the illustrated embodiment, it is understood that all of pre-charge signals $PC_1$-$PC_8$ can be de-activated low at the same time (before time $T_0$).

If the data values stored in the CAM cells in row 600 do not match the applied comparison data value, the switching transistors in un-matched bits will be turned off. The turned off switching transistors located closest to match line driver circuit 350 will stop the propagation of the logic high pulse signal $V_P$ driven by match line driver circuit 350. This results in power savings within row 600.

Figure 9:
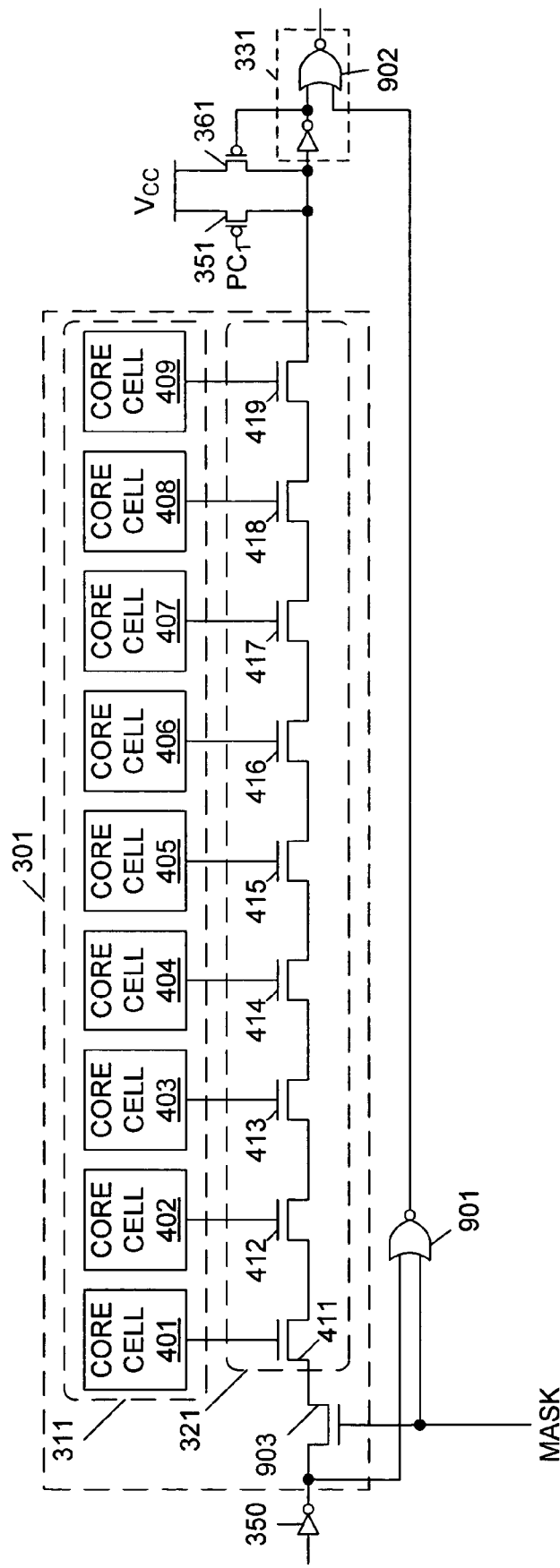
FIG. 9 is a block diagram of a bypass circuit for a CAM cell set in accordance with one variation of the present invention.

FIG. 9 is a block diagram of bypass circuit for CAM cell set 301 in accordance with one variation of the present invention. This variation includes a bypass circuit, which includes NOR gates 901-902 and n-channel pass transistor 903. NOR gate 902 replaces the second inverter in repeater 331. One input terminal of NOR gate 902 is coupled to the output terminal of the first inverter in repeater 331. The other input terminal of NOR gate 902 is coupled to the output terminal of NOR gate 901. NOR gate 901 is configured to receive an active low MASK# signal and the output signal provided by match line driver circuit 350. Transistor 903 has a drain coupled to match line driver circuit 350, a source coupled to the drain of transistor 411, and a gate coupled to receive the MASK# signal.

When the MASK# signal has a logic high value, transistor 903 is turned on, and NOR gate 901 provides a logic low value to NOR gate 902. As a result, the output signal provided by match line driver circuit 350 is provided to transistor 411, and NOR gate 902 operates as an inverter. Thus, CAM cell set 301 operates in the manner described above in connection with FIGS. 3 and 4.

However, when the MASK# signal is activated low, transistor 903 is turned off. The logic low output signal provided by match line driver circuit 350 during a comparison operation causes NOR gate 901 to provide a logic high signal to NOR gate 902. In response, NOR gate 902 provides a logic low signal to the next set of transistors 322, regardless of the match/non-match conditions of core cells 311. As a result, core cells 311 are effectively masked in response to the low MASK# signal. Masking these core CAM cells 311 advantageously saves power in the associated row 300.

Although the mask circuitry has been shown in connection with CAM cell set 301, it is understood that the other CAM cell sets 302-308 can have similar (independent) mask circuitry. Moreover, it is understood that the bypass circuit of FIG. 9 can be applied to the circuitry of row 600 (FIG. 6).

Figure 10:
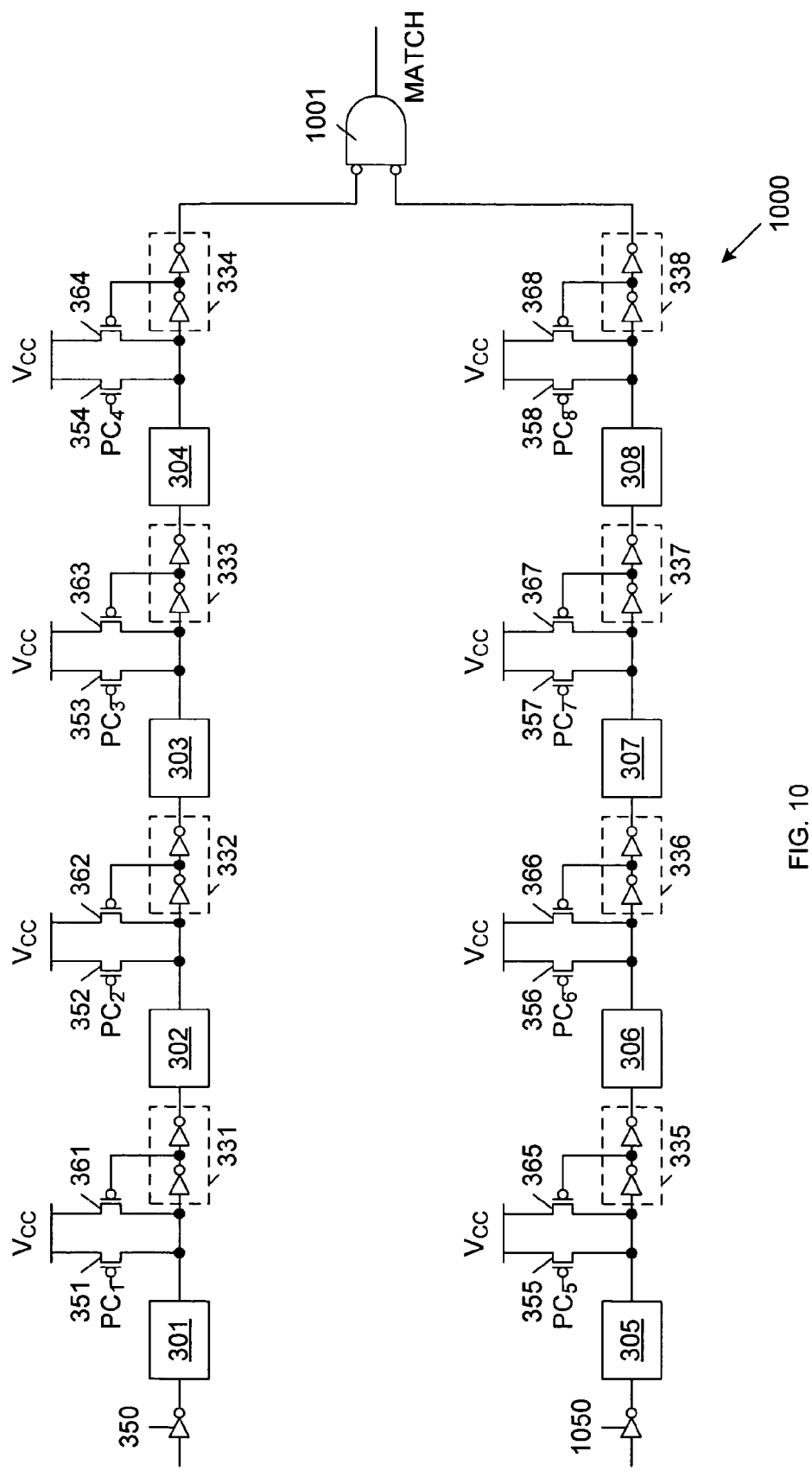
FIG. 10 is a block diagram of a divided row of NAND-type CAM cells in accordance with another embodiment of the present invention.

FIG. 10 is a block diagram of a CAM cell row 1000 in accordance with another embodiment of the present invention. Similar elements in FIGS. 10 and 3 are labeled with similar reference numbers. In this embodiment, the above-described elements of row 300 are divided in half, with CAM cell sets 301-304 and the associated repeaters 331-334, pre-charge transistors 351-354 and pull-up transistors 361-364 coupled to a first inverting input terminal of AND gate 1001, and CAM cell sets 305-308 and the associated repeaters 335-338, pre-charge transistors 355-358 and pull-up transistors 365-368 coupled to a second inverting input terminal of AND gate 1001. The output terminal of AND gate 1001 provides the MATCH signal. Match line driver circuit 1050, which is coupled to CAM cell set 305, operates in the same manner as match line driver circuit 350 (which remains coupled to CAM cell set 301). Thus, during a comparison operation, match line driver circuits 350 and 1050 provide logic low signals to CAM cell sets 301 and 305, respectively. If a match condition occurs, repeaters 334 and 338 both provide logic low signals to the inverting input terminals of AND gate 1001. As a result, AND gate 1001 activates the MATCH signal to a logic high state.

Dividing a CAM cell row in half as illustrated in FIG. 10 significantly reduces the time required to perform a comparison operation. Although the CAM cell row has been divided in half in FIG. 10, it is understood that a CAM cell row can be further divided in other embodiments. For example, a CAM cell row can be divided into three or more sub-rows in other embodiments.

In one variation, the second inverters of repeaters 334 and 338 can be eliminated. In this variation, the input terminals of AND gate 1001 are modified to be non-inverting input terminals. The logic of the circuit remains unchanged.

Figure 11:
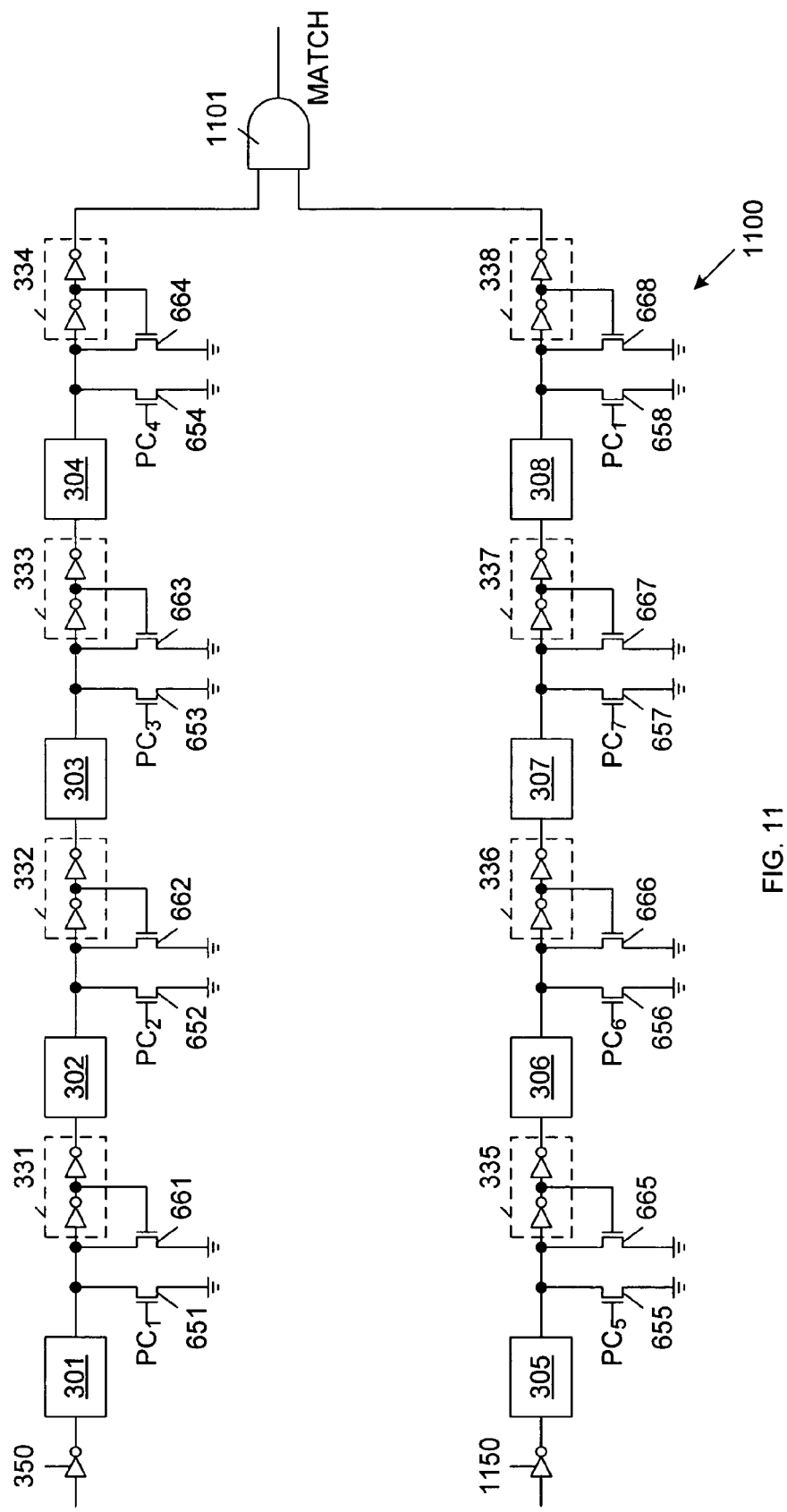
FIG. 11 is a block diagram of another divided row of NAND-type CAM cells in accordance with yet another embodiment of the present invention.

FIG. 11 is a block diagram of a CAM cell row 1100 in accordance with another embodiment of the present invention. CAM cell row 1100 employs a similar structure to CAM cell row 1000, but uses the basic structure of CAM cell row 600. Thus, similar elements in FIGS. 11 and 6 are labeled with similar reference numbers. In FIG. 11, CAM cell sets 301-304 and the associated repeaters 331-334, pre-charge transistors 651-654 and pull-down transistors 661-664 are coupled to a inverting input terminal of AND gate 1101, and CAM cell sets 305-308 and the associated repeaters 335-338, pre-charge transistors 655-658 and pull-down transistors 665-668 coupled to a second input terminal of AND gate 1101. The output terminal of AND gate 1101 provides the MATCH signal. Match line driver circuit 1150, which is coupled to CAM cell set 305, operates in the same manner as match line driver circuit 350 (which remains coupled to CAM cell set 301). Thus, during a comparison operation, match line driver circuits 350 and 1150 provide logic high signals to CAM cell sets 301 and 305, respectively. If a match condition occurs, repeaters 334 and 338 both provide logic high signals to the inverting input terminals of AND gate 1101. As a result, AND gate 1101 activates the MATCH signal to a logic high state.

Again, it is understood that CAM cell row 1100 can be further divided in other embodiments. For example, CAM cell row 1100 can be divided into three or more sub-rows in other embodiments.

In other embodiments, the bypass circuitry of FIG. 9 can be included in CAM cell row 1000 (FIG. 10) or CAM cell row 1100 (FIG. 11).

Although the invention has been described in connection with several embodiments, it is understood that this invention is not limited to the embodiments disclosed, but is capable of various modifications, which would be apparent to a person skilled in the art. Thus, the invention is limited only by the following claims.

I claim:

1. A content addressable memory (CAM) system comprising:
   a row of NAND-type CAM cells divided into a plurality of segments of NAND-type CAM cells, wherein each of the segments of NAND-type CAM cells includes a plurality of series-connected switching transistors;
   one or more repeater circuits, wherein each of the repeater circuits couples adjacent segments of NAND-type CAM cells;
   a match line driver circuit connected to a first end of the row of NAND-type CAM cells; and
   a match line connected to a second end of the row of NAND-type CAM cells.

2. A content addressable memory (CAM) system comprising:
   a row of NAND-type CAM cells divided into a plurality of segments of NAND-type CAM cells, wherein each of the segments of NAND-type CAM cells includes a plurality of series-connected switching transistors;
   one or more repeater circuits, wherein each of the repeater circuits couples adjacent segments of NAND-type CAM cells, wherein each of the repeater circuits comprises a pair of series-connected inverters;
   a match line driver circuit connected to a first end of the row of NAND-type CAM cells; and
   a match line connected to a second end of the row of NAND-type CAM cells.

3. The CAM system of claim 1, wherein each plurality of series-connected switching transistors is connected to a repeater circuit.

4. A content addressable memory (CAM) system comprising:
   a row of NAND-type CAM cells divided into a plurality of segments of NAND-type CAM cells, wherein each of the segments of NAND-type CAM cells includes a plurality of series-connected switching transistors;
   one or more repeater circuits, wherein each of the repeater circuits couples adjacent segments of NAND-type CAM cells;
   a match line driver circuit connected to a first end of the row of NAND-type CAM cells, wherein the match line driver circuit comprises means for driving a pulse onto the first end of the row of NAND-type CAM cells; and
   a match line connected to a second end of the row of NAND-type CAM cells.

5. The CAM system of claim 1, wherein the match line driver circuit comprises means for pulling down the first end of the row of NAND-type CAM cells to ground.

6. The CAM system of claim 1, further comprising a plurality of pre-charge transistors, wherein a pre-charge transistor is coupled between an input terminal of a corresponding repeater and a voltage supply terminal.

7. The CAM system of claim 6, further comprising a plurality of pull transistors, wherein a pull transistor is coupled between an input terminal of a corresponding repeater and the voltage supply terminal, and has a gate coupled an output terminal of the corresponding repeater.

8. The CAM system of claim 1, wherein the row of NAND-type CAM cells comprises sixteen or more NAND-type CAM cells.

9. A method of operating a content addressable memory (CAM) system comprising:
   providing a first match control signal to a first set of NAND-type CAM cells;
   performing a first comparison operation with the first set of NAND-type CAM cells;
   routing the first match control signal through the first set of NAND-type CAM cells if the first comparison operation results in match;
   boosting the first match control signal routed through the first set of NAND-type CAM cells, thereby providing a second match control signal;
   performing a second comparison operation with a second set of NAND-type CAM cells, wherein the second comparison operation is performed in parallel with the first comparison operation; and routing the second match control signal through the second set of NAND-type CAM cells if the first and second comparison operations both result in a match.

10. The method of claim 9, further comprising activating a match signal in response to the second match control signal routed through the second set of NAND-type CAM cells.

11. The method of claim 9, further comprising:

boosting the second match control signal routed through the second set of NAND-type CAM cells, thereby providing a third match control signal;

performing a third comparison operation with a third set of NAND-type CAM cells, wherein the third comparison operation is performed in parallel with the first and second comparison operations; and routing the third match control signal through the third set of NAND-type CAM cells if the first, second and third comparison operations all result in a match.

12. The method of claim 9, further comprising activating the first match control signal by pulsing the first match control signal to a $V_{CC}$ supply voltage level.

13. The method of claim 9, further comprising activating the first match control signal by pulling the first match control signal to ground.

14. The method of claim 9, further comprising pre-charging a match line coupled to the second set of NAND-type CAM cells prior to the first and second comparison operations.

* * * * *